United States Patent
Tokuda et al.

(10) Patent No.: US 10,254,417 B2
(45) Date of Patent: Apr. 9, 2019

(54) SEMICONDUCTOR DETECTOR

(71) Applicant: Shimadzu Corporation, Kyoto (JP)

(72) Inventors: Satoshi Tokuda, Kyoto (JP); Toshinori Yoshimuta, Kyoto (JP); Hiroyuki Kishihara, Kyoto (JP); Yukihisa Wada, Kyoto (JP)

(73) Assignee: Shimadzu Corporation, Kyoto (JP)

( * ) Notice: Subject to any disclaimer, the term of this patent is extended or adjusted under 35 U.S.C. 154(b) by 0 days.

(21) Appl. No.: 15/776,809

(22) PCT Filed: Nov. 19, 2015

(86) PCT No.: PCT/JP2015/082605
§ 371 (c)(1),
(2) Date: May 17, 2018

(87) PCT Pub. No.: WO2017/085842
PCT Pub. Date: May 26, 2017

(65) Prior Publication Data
US 2018/0329081 A1    Nov. 15, 2018

(51) Int. Cl.
*G01T 1/24* (2006.01)
*G01T 1/20* (2006.01)
(Continued)

(52) U.S. Cl.
CPC ................ *G01T 1/20* (2013.01); *G01T 1/24* (2013.01); *G01T 7/00* (2013.01); *H01L 27/146* (2013.01);
(Continued)

(58) Field of Classification Search
CPC .... G01T 1/20; G01T 1/24; G01T 7/00; H01L 2224/16225; H01L 2224/73204; H01L 27/146; H01L 27/14618; H01L 31/108
See application file for complete search history.

(56) References Cited

U.S. PATENT DOCUMENTS 5,254,480 A * 10/1993 Tran ............... H01L 21/8222
250/370.09
2007/0122934 A1* 5/2007 Lin ............... H01L 31/035281
438/69
(Continued)

FOREIGN PATENT DOCUMENTS

JP        2001-177141 A    6/2001

OTHER PUBLICATIONS

International Search Report with English translation and Written Opinion dated Feb. 9, 2016 of corresponding International Application No. PCT/JP2015/082605; 5 pgs.

*Primary Examiner* — Marcus H Taningco
(74) *Attorney, Agent, or Firm* — Maier & Maier, PLLC

(57) ABSTRACT

In a radiation detector, a Schottky electrode is formed such that an interdiffusion coefficient between the material of an outermost surface electrode formed on the Schottky electrode and the material of the Schottky electrode is smaller than an interdiffusion coefficient between the material of the outermost surface electrode and Al (aluminum). Consequently, the material of the outermost surface electrode does not diffuse into the Schottky electrode, and Schottky functions can be maintained, and at the same time, the material of the Schottky electrode does not diffuse into the outermost surface electrode, and the outermost surface electrode can be prevented from alloying.

15 Claims, 4 Drawing Sheets

(51) Int. Cl.
*G01T 7/00* (2006.01)
*H01L 27/146* (2006.01)
*H01L 31/108* (2006.01)

(52) U.S. Cl.
CPC ...... H01L 27/14618 (2013.01); H01L 31/108 (2013.01); *H01L 2224/16225* (2013.01); *H01L 2224/73204* (2013.01)

(56) References Cited

U.S. PATENT DOCUMENTS

2009/0250692 A1* 10/2009 Szeles .................... H01L 29/47
257/42
2011/0079869 A1* 4/2011 Mazzillo ........... H01L 27/14643
257/443

* cited by examiner

WORK FUNCTION OF VARIOUS METALS

| METAL | WORK FUNCTION [eV] |
|---|---|
| In | 4.15 |
| Al | 4.28 |
| Ti | 4.35 |
| Cr | 4.5 |

SEMICONDUCTOR DETECTOR

FIELD

The present invention relates to a semiconductor detector used in medical fields, industrial fields, nuclear fields, and the like.

BACKGROUND

The so-called "flip-chip bonding" in which electrodes of a semiconductor chip and electrodes on the signal read-out substrate face each other and are electrically connected to each other through conductive bumps (bump electrodes) has a structure as illustrated in FIG. 6. In FIG. 6, reference numeral 101 denotes a signal read-out substrate, reference numeral 102 denotes a semiconductor chip, reference numeral 103 denotes a pixel electrode, reference numeral 104 denotes a conductive bump, and reference numeral 105 denotes an insulating layer.

The signal read-out substrate 101 is a signal read-out substrate such as a CMOS integrated circuit in which the pixel electrodes 103 are arranged in a two-dimensional matrix shape. In addition, instead of the semiconductor chip, a substrate represented by a counter substrate or the like may be used. The pixel electrodes 103 are formed on the signal read-out substrate 101. The conductive bumps 104 are formed on the semiconductor chip 102 as counter pixel electrodes at positions facing the pixel electrodes 103.

The flip-chip bonding illustrated in FIG. 6 is used for a photodetector or a radiation detector to detect light or radiation and extract a signal obtained by detection. In addition, besides a metal bonding method using a solder bump, a gold bump, or the like, the flip-chip bonding may also include an adhesive bonding method such as conductive resin bonding which is bonding using an organic material or anisotropic conductive member bonding. Besides the flip-chip bonding, the invention can also be applied to cases where both substrates are used for bonding.

In addition, the semiconductor chip or the substrate that detects light or radiation has a photoelectric conversion semiconductor layer. The semiconductor chip or the substrate has a common electrode for applying a bias voltage to the incident side of light or radiation and is configured such that the photoelectric conversion semiconductor layer is interposed between the common electrode and the pixel electrode described above (refer to, for example, Patent Document 1).

In the case of forming the bump electrode on the counter pixel electrode, in metal bonding using a gold bump or the like, by applying pressure, energy such as heat, ultrasonic wave, or the like to the bonding surface between the bump electrode and the pixel electrode, or by using a pressing method of bonding by interdiffusion of metals between a bump material and an electrode material, bonding with high strength and reliability is obtained. As the bump material and the electrode material, Au (gold) as described above which is physically and chemically stable and has an appropriate diffusion coefficient is used.

Patent Document 1: JP-A-2001-177141

SUMMARY

However, there are the following problems in bonding by the pressing method. That is, in the photodetector or the radiation detector using a semiconductor as the photoelectric conversion semiconductor layer (detection layer) described above, it is necessary to suppress a leak current, and thus, a high resistance semiconductor is used. In the case of further suppressing the leak current, a barrier of an electrode (Schottky electrode) having a Schottky function is used. In the case of a P-type semiconductor, a metal having a low work function such as In (indium) or Al (aluminum) as described in Patent Document 1 (JP-A-2001-177141) is used as the Schottky electrode, the metal tends to thermally diffuse.

Therefore, it has found out that, in a case where a metal having a low work function is used for a pixel electrode on a semiconductor, interdiffusion occurs between Au of the bump material and the Schottky electrode during the thermocompression bonding, so that defective bonding occurs. More specifically, as a result of diffusion of In or Al into the Au bump, the bump electrode is formed as an alloy, and thus, defective bonding occurs between the bump electrode and the counter pixel electrode. In addition, when In is used as a pixel electrode material, since the diffusion coefficient of In in a semiconductor is very large, in a fine-pitch detector, leakage between pixels is increased, and thus, the spatial resolution is deteriorated.

The invention has been made in view of such circumstances, and an object thereof is to provide a semiconductor detector capable of obtaining a bonding having higher mechanical strength and reliability with a low leak current.

In order to achieve such an object, the invention has the following configuration.

That is, a semiconductor detector (the former) according to an aspect of the invention includes: one semiconductor chip or substrate having a photoelectric conversion semiconductor layer which detects light or radiation and on which a plurality of pixel electrodes are formed; the other semiconductor chip or substrate on which counter pixel electrodes are formed at positions facing the respective pixel electrodes and from which a signal detected by the photoelectric conversion semiconductor layer is read out; and bump electrodes, each of which is formed on any one of the pixel electrode and the counter pixel electrode, wherein the semiconductor detector has a structure where the counter pixel electrode and the bump electrode on the pixel electrode are mechanically and electrically connected to each other or a structure where the pixel electrode and the bump electrode on the counter pixel electrode are mechanically and electrically connected to each other, wherein a material of an electrode being in contact with the photoelectric conversion semiconductor layer has a Schottky function with respect to the photoelectric conversion semiconductor layer, wherein an electrode having the Schottky function is formed such that an interdiffusion coefficient between a material of an outermost surface electrode formed on the electrode having the Schottky function and a material of the electrode having the Schottky function is smaller than an interdiffusion coefficient between the material of the outermost surface electrode and Al (aluminum), and wherein the pixel electrode is formed by a stacked structure of the electrode having the Schottky function and the outermost surface electrode.

In addition, a semiconductor detector (the latter) according to another aspect of the invention, which is different from the former, includes: one semiconductor chip or substrate having a photoelectric conversion semiconductor layer which detects light or radiation and on which a plurality of pixel electrodes are formed; the other semiconductor chip or substrate on which counter pixel electrodes are formed at positions facing the respective pixel electrodes and from which a signal detected by the photoelectric conversion semiconductor layer is read out; and bump electrodes, each of which is formed on any one of the pixel electrode and the counter pixel electrode, wherein the semiconductor detector has a structure where the counter pixel electrode and the bump electrode on the pixel electrode are mechanically and electrically connected to each other or a structure where the pixel electrode and the bump electrode on the counter pixel electrode are mechanically and electrically connected to each other, wherein a material of an electrode being in contact with the photoelectric conversion semiconductor layer has a Schottky function with respect to the photoelectric conversion semiconductor layer, wherein an electrode having the Schottky function, an electrode including an intermediate metal layer, and an outermost surface electrode are stacked in this order to form the pixel electrode, and wherein an interdiffusion coefficient between a material of the outermost surface electrode and a material of the electrode including the intermediate metal layer is smaller than an interdiffusion coefficient between the material of the outermost surface electrode and a material of the electrode having the Schottky function.

According to the semiconductor detector (former) according to the invention, the electrode having the Schottky function is formed such that the interdiffusion coefficient between the material of the outermost surface electrode formed on the electrode having the Schottky function and the material of the electrode having the Schottky function is smaller than the interdiffusion coefficient between the material of the outermost surface electrode and Al (aluminum). Accordingly, while maintaining the Schottky function without allowing the material of the outermost surface electrode to diffuse into the electrode having the Schottky function, it is possible to prevent the outermost surface electrode from being formed as an alloy without allowing the material of the electrode having the Schottky function to diffuse into the outermost surface electrode. As a result, it is possible to obtain bonding having higher mechanical strength and reliability with a low leak current.

In addition, according to the semiconductor detector (the latter) according to the invention different from the former, the electrode having the Schottky function, the electrode including the intermediate metal layer, and the outermost surface electrode are stacked in this order. The electrodes are formed such that the interdiffusion coefficient between the material of the outermost surface electrode and the material of the electrode including the intermediate metal layer is smaller than the interdiffusion coefficient between the material of the outermost surface electrode and the material of the electrode having the Schottky function. Accordingly, while maintaining the Schottky function without allowing the material of the outermost surface electrode to diffuse into the electrode having the Schottky function, it is possible to prevent the outermost surface electrode from being formed as an alloy without allowing the material of the electrode having the Schottky function to diffuse into the outermost surface electrode. In addition, by using a material having a higher Schottky barrier with respect to a photoelectric conversion semiconductor than the intermediate metal layer for the material of the electrode that is in contact with the photoelectric conversion semiconductor layer, it is possible to obtain bonding having a high mechanical strength and high reliability and a lower leakage.

DETAILED DESCRIPTION OF THE DRAWINGS

Figure 1:
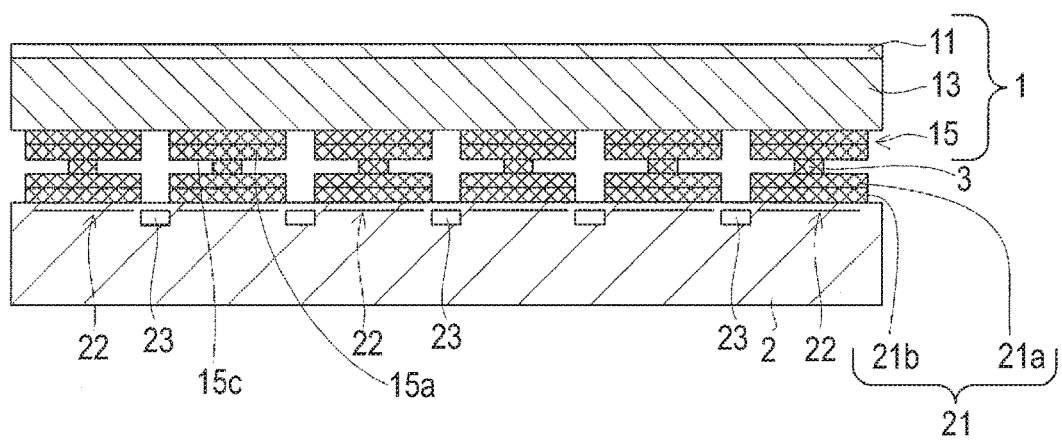
FIG. 1 is a schematic cross-sectional view of a semiconductor detector (radiation detector) according to a first embodiment.
Figure 2:
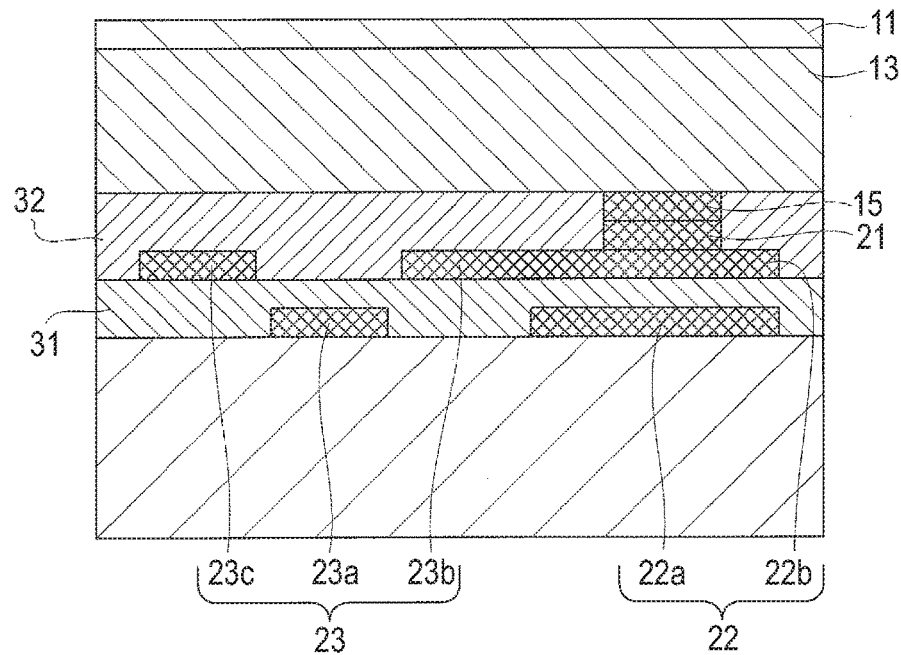
FIG. 2 is a schematic cross-sectional view illustrating a specific configuration of a semiconductor chip and a counter substrate (signal read-out substrate) of a semiconductor detector (radiation detector) according to each embodiment.
Figure 3:
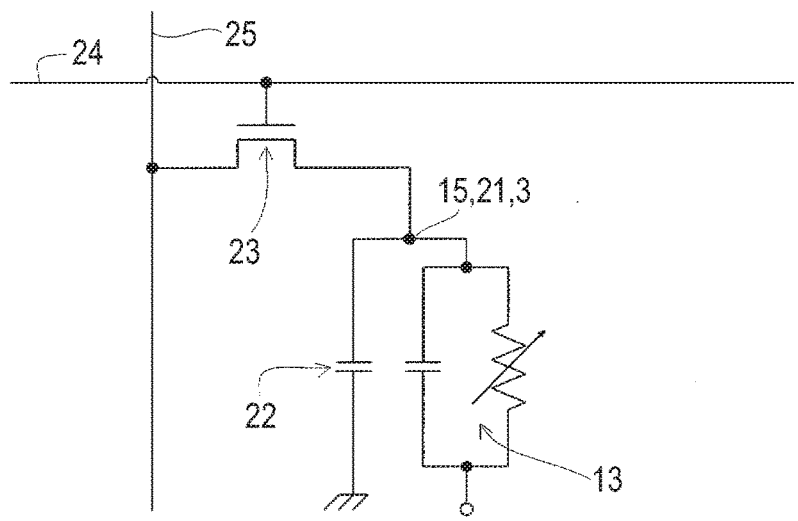
FIG. 3 illustrates an equivalent circuit per unit pixel of the counter substrate (signal read-out substrate) of the semiconductor detector (radiation detector) according to each embodiment.

Hereinafter, a first embodiment of the invention will be described with reference to the drawings. FIG. 1 is a schematic cross-sectional view of a semiconductor detector (radiation detector) according to the first embodiment. FIG. 2 is a schematic cross-sectional view illustrating a specific configuration of a semiconductor chip and a counter substrate (signal read-out substrate) of a semiconductor detector (radiation detector) according to each embodiment. FIG. 3 illustrates an equivalent circuit per unit pixel of the counter substrate (signal read-out substrate) of the semiconductor detector (radiation detector) according to each embodiment. Including the second embodiment to be described later, in the first embodiment, the semiconductor detector is used as a radiation detector. In addition, in FIG. 2, bump electrodes are omitted in illustration.

As illustrated in FIGS. 1 to 3, the radiation detector includes a semiconductor chip 1 and a counter substrate 2 arranged so as to face the semiconductor chip 1. The semiconductor chip 1 is formed by stacking a common electrode 11, a photoelectric conversion semiconductor layer 13, and pixel electrodes 15 in this order. On the other hand, the counter substrate 2 is configured as a signal read-out substrate including counter pixel electrodes 21 arranged in a two-dimensional matrix shape and a pixel arrangement layer in which the counter pixel electrodes are arranged. The counter pixel electrode 21 is formed at a position facing the pixel electrode 15. More specifically, the pixel electrode 15 of the semiconductor chip 1 and the counter pixel electrode 21 of the counter substrate 2 are allowed to face each other and bonded to each other with the bump electrodes 3 formed by sputter deposition, screen printing, plating, or the like.

The counter substrate 2 is formed with a Si (silicon) or glass substrate. On the counter substrate 2, besides the counter pixel electrodes 21, pixel capacitors 22 and switching transistors 23 are formed in a two-dimensional matrix shape, and scan lines 24 (refer to FIG. 3) and signal read-out lines 25 (refer to FIG. 3) are formed to be patterned horizontally and vertically in row and column directions, respectively.

More specifically, as illustrated in FIG. 2, a reference electrode 22a of the pixel capacitor 22 and a gate electrode 23a of the switching transistor 23 are stacked on the counter substrate 2 and are covered with an interlayer insulating film 31. A capacitor electrode 22b of the pixel capacitor 22 is stacked on the interlayer insulating film 31 so as to face the reference electrode 22a with the interlayer insulating film 31 interposed therebetween. A source electrode 23b and a drain electrode 23c of the switching transistor 23 are stacked and covered with a sealing material 32 except for a portion where the counter pixel electrode 21 exists. In addition, the capacitor electrode 22b and the source electrode 23b are electrically connected to each other. As illustrated in FIG. 2, the capacitor electrode 22b and the source electrode 23b may be integrally and simultaneously formed. The reference electrode 22a is grounded. For the interlayer insulating film 31, for example, a plasma SiN is used.

As illustrated in FIG. 3, the scan line 24 is electrically connected to the gate electrode 23a (refer to FIG. 2) of the switching transistor 23, and the signal read-out line 25 is electrically connected to the drain electrode 23c (refer to FIG. 2) of the switching transistor 23. The scan lines 24 extend in the row direction of the respective pixels, and the signal read-out lines 25 extend in the column direction of the respective pixels. The scan line 24 and the signal read-out line 25 are perpendicular to each other. In FIG. 3, reference numeral 13 is an equivalent circuit of the photoelectric conversion semiconductor layer. Including the scan lines 24 and the signal read-out lines 25, the pixel capacitors 22, the switching transistors 23, and the interlayer insulating film 31 are formed to be patterned as a pixel arrangement layer on the surface of the counter substrate 2 by using a semiconductor thin film manufacturing technique or a fine processing technique.

CdTe (cadmium telluride), ZnTe (zinc telluride), CdZnTe (cadmium zinc telluride), GaAs (gallium arsenide), or the like is used as the semiconductor chip 1 that detects radiation.

As described above, the pixel electrode 15 of the semiconductor chip 1 and the counter pixel electrode 21 of the counter substrate 2 are allowed to face each other and bonded to each other. By connecting the bump electrodes 3 formed by sputter deposition, screen printing, plating, or the like to the counter pixel electrodes 21 in the portions which are not covered with the interlayer insulating film 31, the pixel electrodes 15 of the semiconductor chip 1 and the counter pixel electrodes 21 of the counter substrate 2 are allowed to face each other and bonded each other. The specific structure, manufacturing method, materials, and dimensions (sizes) of the pixel electrode 15 and counter pixel electrode 21 will be described later in detail.

The radiation detector obtained in this manner detects radiation by converting radiation information into charge information (electron-hole pair carriers) according to incidence of the radiation. In summary, the radiation detector includes the semiconductor chip 1 and the counter substrate 2, and the photoelectric conversion semiconductor layer 13 of the semiconductor chip 1 detects the radiation, and the detected signal is read out through the switching transistor 23 of the counter substrate 2. The semiconductor chip 1 includes the common electrode 11 that applies a bias voltage (negative bias voltage of −0.1 V/μm to 1 V/μm in each embodiment) and the photoelectric conversion semiconductor layer 13 that converts the radiation information into the charge information (electron-hole pair carriers). The counter substrate 2 includes the counter pixel electrodes 21 which are arranged in a two-dimensional matrix shape and read out the charge information (electron-hole pair carriers) and the pixel arrangement layer in which the counter pixel electrodes are arranged.

The operation of the radiation detector will be described with reference to FIGS. 1 to 3. The radiation (for example, X-rays) is incident in the state where the bias voltage is applied to the common electrode 11, so that the electron-hole pair carriers are generated in the photoelectric conversion semiconductor layer 13 and temporarily stored in the pixel capacitors 22. By driving the scan line 24 at a required timing, the switching transistor 23 connected to the scan line 24 is turned on, and the electron-hole pair carriers accumulated in the pixel capacitor 22 are read out as signal charges to be read out to a signal acquisition circuit (not illustrated) of the subsequent stage through the signal read-out line 25 connected to the switching transistor 23.

Since each pixel electrode 15 and each counter pixel electrode 21 correspond to each pixel, the signal charges read out corresponding to the pixel electrode 15 and the counter pixel electrode 21 are converted into pixel values, and thus, by arranging the pixel values according to the pixels in two dimensions, a two-dimensional image (radiation image having a two-dimensional distribution) can be acquired.

Figure 4:
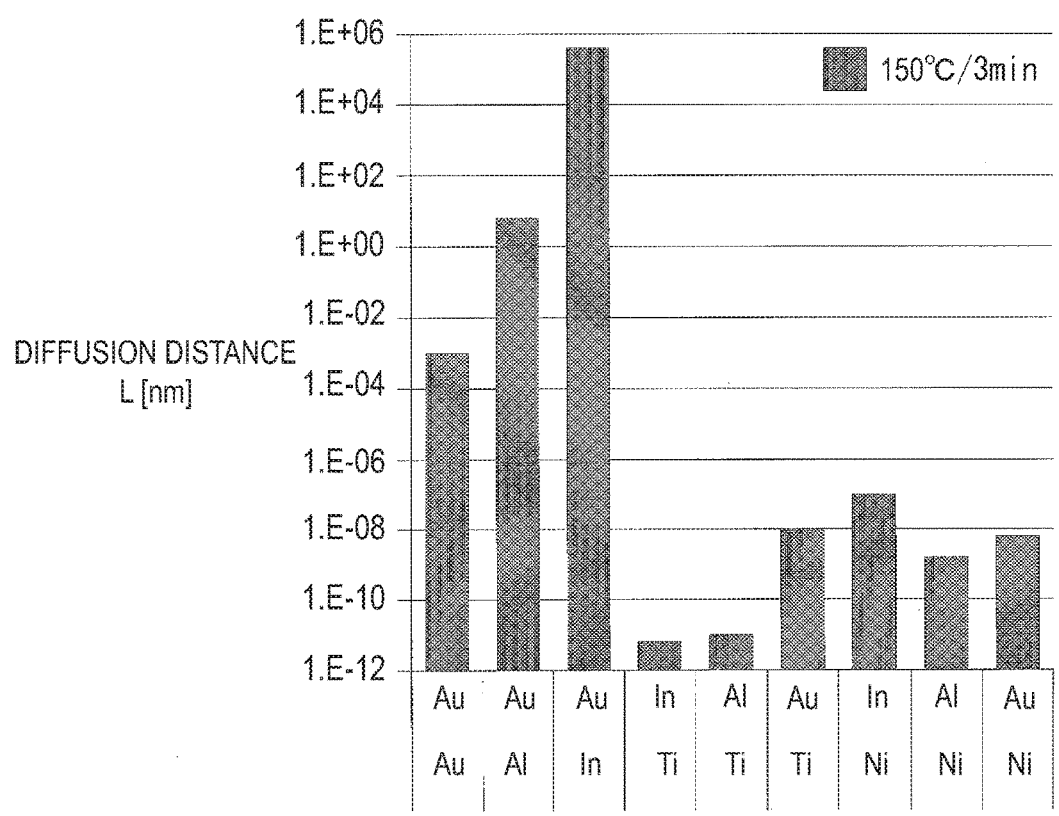
FIG. 4 illustrates comparison of a diffusion distance between electrode metals during thermocompression bonding.

The structure, manufacturing method, materials, and dimensions (sizes) of the pixel electrode 15 and the counter pixel electrode 21 will be described with reference to FIG. 4. FIG. 4 is a comparison of a diffusion distance between electrode metals during the thermocompression bonding. In addition, in FIG. 4, "1.En" (n is an integer) represents $1.0 \times 10^n$ (that is, exponential notation). For example, "1.E+06" in FIG. 4 represents $1.0 \times 10^6$, "1.E+00" in FIG. 4 represents $1.0 \times 10^0 (=1.0)$, and "1.E-12" represents $1.0 \times 10^{-12}$.

For example, a case where a common electrode of Pt is formed on the back surface of a CdTe crystal and a pixel electrode including a stacked structure of an electrode (Schottky electrode) of Ti having a Schottky function and an outermost surface electrode of Au is formed on the counter surface (front surface) of the CdTe crystal) will be described. First, in order to stand up the Schottky barrier, impurities are removed according to chemical reaction by plasma treatment or Br (bromine) methanol treatment as in the aforementioned Patent Document 1: JP-A-2001-177141 on the counter surface of the CdTe crystal, so that the counter surface (interface) of the CdTe crystal is cleaned.

Next, the common electrode 11 of Pt (refer to FIG. 1) is formed on the back surface (substantially entire surface) of the CdTe crystal, and pixel electrodes 15 of Au/Ti (refer to FIG. 1) each including a stacked structure of an outermost surface electrode 15a of Au (refer to FIG. 1) with □10 μm and an electrode (Schottky electrode) 15c of Ti having a Schottky function (refer to FIG. 1) are formed with a pitch of □20 μm on the counter surface of a photoelectric conversion semiconductor layer 13 (refer to FIG. 1) including the CdTe crystal with the common electrode 11 of Pt formed on the back surface (substantially entire surface) thereof. In addition, a bump electrode 3 of Au (refer to FIG. 1) of φ 3 μm×t 0.25 μm is formed at the center of each of the pixel electrodes 15. In addition, □ represents a square, φ represents diameter, and t represents a thickness. For example, "□ 10 μm" represents 10 μm square (=10 μm×10 μm).

With respect to the pixel electrode 15, after a resist pattern is formed on a portion (non-pixel electrode) where no pixel electrode is formed by photolithography, the Schottky electrode 15c of Ti and the outermost surface electrode 15a of Au are sequentially formed with a predetermined film thickness by a vapor deposition or sputtering method. In the first embodiment, after forming the Schottky electrode 15c of Ti with t 0.05 μm, the outermost surface electrode 15a of Au with t 0.1 μm is formed.

On the other hand, by the same method as the pixel electrodes 15, the counter pixel electrodes 21 of Au/Ti (refer to FIG. 1) with □10 μm×t 0.1 μm are formed with a pitch of 20 μm on the Si counter substrate 2. In addition, a bump electrode 3 of Au (refer to FIG. 1) of ϕ 3 μm×t 0.25 μm is formed at the center of each of the pixel electrodes 15. In addition, including the second embodiment to be described later, in the first embodiment, the bump electrodes 3 of Au are formed on the pixel electrodes 15 of the CdTe crystal (the one semiconductor chip). However, the bump electrodes 3 of Au may be formed on the counter pixel electrode 21 of the Si counter substrate 2.

In any one of the cases, by using a flip chip bonder, the CdTe crystal and the Si counter substrate are heated and close to each other at the facing position, and the positions of the pixel electrode of the CdTe crystal and the counter pixel electrode of the Si counter substrate are aligned to be in contact with each other, and a weight is exerted for a certain time to bond the two electrodes.

The outermost surface electrode 21a (refer to FIG. 1) of the counter pixel electrode 21 is formed of Au, so that the bump electrode 3 is formed of Au which is the same material as the outermost surface electrodes 15a and 21a. As illustrated in FIG. 4, in a case where a thermal load of 150° C./3 minutes is applied, when a diffusion distance L between Au is about $1.0 \times 10^{-3}$ (nm), a self-diffusion coefficient of Au is large, and thus, the bump electrodes 3 come into direct contact with the outermost surface electrodes 15a and 21a, so that the thermocompression bonding becomes good.

As illustrated in FIG. 4, in a case where a thermal load of 150° C./3 minutes in consideration that thermocompression bonding of Au/Au is applied, since the interdiffusion coefficient between Au and Al is large (refer to the diffusion distance L between Au and Al in FIG. 4), when Schottky electrode is formed of Al like the related art, interdiffusion occurs between Au of the bump material and Al of the material of the Schottky electrode. As described in the section "Technical Problem", as a result of diffusion of Al into the Au bump, the bump electrode is formed as an alloy, and thus, defective bonding occurs between the bump electrode and the counter pixel electrode. Conversely, when Au diffuses into the Al Schottky electrode, the electrode does not function as a Schottky electrode. As a result, when the Schottky electrode is formed of Al like the related art, the function as a Schottky electrode is not fulfilled, and Al also diffuses and precipitates on the bump bonding surface of Au, so that the compression cannot be performed.

Therefore, the Schottky electrode is formed such that the interdiffusion coefficient between the material of the outermost surface electrode formed on the Schottky electrode and the material of the Schottky electrode is smaller than the interdiffusion coefficient between the material of the outermost surface electrode and Al. The outermost surface electrode is formed of Au, and as a combination with the electrode material having the Schottky function, there is Au.Ti in addition to Au.Al as illustrated in FIG. 4. In addition, although omitted in FIG. 4, there is Au.Cr (chromium). Since the interdiffusion coefficient in Au.Ti is the interdiffusion coefficient in Au.Cr is smaller than the interdiffusion coefficient in Au.Al, in a case where the outermost surface electrode is formed of Au, the Schottky electrode is formed of Ti or Cr.

In this manner, the Schottky electrode of Ti or Cr and the outermost surface electrode of Au are stacked in this order, and the pixel electrode 15 and further the counter pixel electrode 21 are formed by the stacked structure of the outermost surface electrode of Au and the Schottky electrode of Ti (or Cr), so that interaction (interdiffusion) between the Schottky electrode and the outermost surface electrode is sufficiently suppressed against the load of the thermocompression bonding. As a result, it has been found out that suppression of the leak current due to the Schottky barrier can be maintained, and the thermocompression bonding with the Au bumps becomes possible.

According to the radiation detector according to the first embodiment having the above-described configuration, the material of the electrode (Schottky electrode 15c) being in contact with the photoelectric conversion semiconductor layer 13 is formed so as to have a Schottky function with respect to the photoelectric conversion semiconductor layer 13, so that it is possible to suppress the leak current to a low level. In addition, the electrode (Schottky electrode 15c) having the Schottky function is formed such that the interdiffusion coefficient between the material of the outermost surface electrode 15a formed on the electrode (Schottky electrode 15c) having the Schottky function and the material of the electrode (Schottky electrode 15c) having the Schottky function is smaller than the interdiffusion coefficient between the material of the outermost surface electrode 15a and Al. Accordingly, while maintaining the Schottky function without allowing the material of the outermost surface electrode 15a to diffuse into the electrode (Schottky electrode 15c) having the Schottky function, it is possible to prevent the outermost surface electrode 15a from being formed as an alloy without allowing the material of the electrode (Schottky electrode 15c) having the Schottky function to diffuse into the outermost surface electrode 15a. As a result, it is possible to obtain bonding having higher mechanical strength and reliability with a low leak current.

In the first embodiment, the outermost surface electrode 15a and the bump electrode 3 are formed of the same material. In particular, in the first embodiment, the outermost surface electrode 15a is Au, and the bump electrode 3 is Au which is the same material as the outermost surface electrode 15a. In addition, the outermost surface electrode 21a of the counter pixel electrode 21 is also formed of Au, and thus, the bump electrode 3 is formed of Au which is the same material as the outermost surface electrodes 15a and 21a. Since the self-diffusion coefficient of Au is large, in a case where the thermal load is applied, the bump electrodes 3 come into direct contact with the outermost surface electrodes 15a and 21a, so that the thermocompression bonding becomes good.

In addition, instead of Au, Cu (copper) may be used for the outermost surface electrode and the bump electrode. Even in the case of using Cu, the same function and effect as in the case of using Au are exhibited.

The pixel electrodes 15, the counter pixel electrodes 21, and the bump electrodes 3 are arranged one-dimensionally or two-dimensionally (two-dimensionally in each embodiment) such that the pixel pitch is less than 50 μm (20 μm in each embodiment). In the first embodiment, since the electrode having the Schottky function (Schottky electrode 15c) contains any one of Ti and Cr, unlike a case where In is used as the Schottky electrode in the related art, leakage between pixels can be suppressed even with a fine-pitch detector having a pixel pitch of less than 50 μm, so that the spatial resolution is not deteriorated.

The photoelectric conversion semiconductor layer 13 of one semiconductor chip or substrate (semiconductor chip 1 in each embodiment) is any one of CdTe, ZnTe, CdZnTe, and GaAs.

Figure 5:
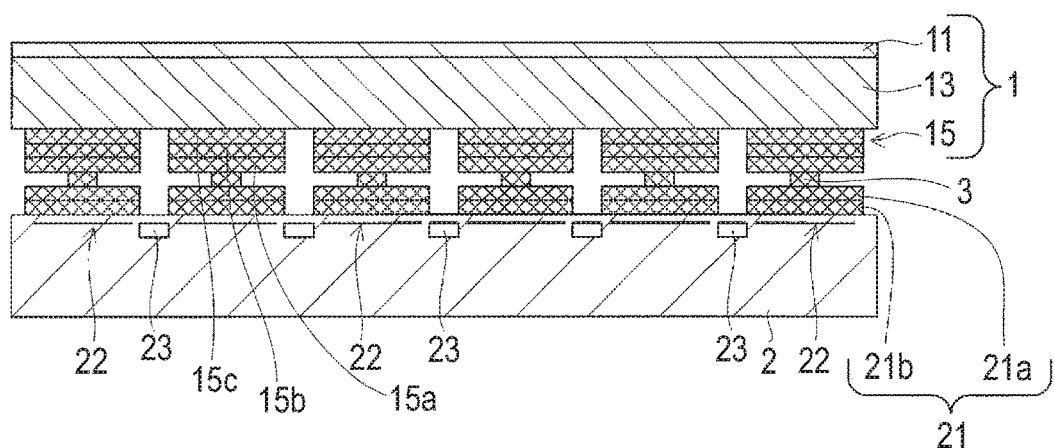
FIG. 5 is a schematic cross-sectional view of a semiconductor detector (radiation detector) according to a second embodiment.
Figure 6:
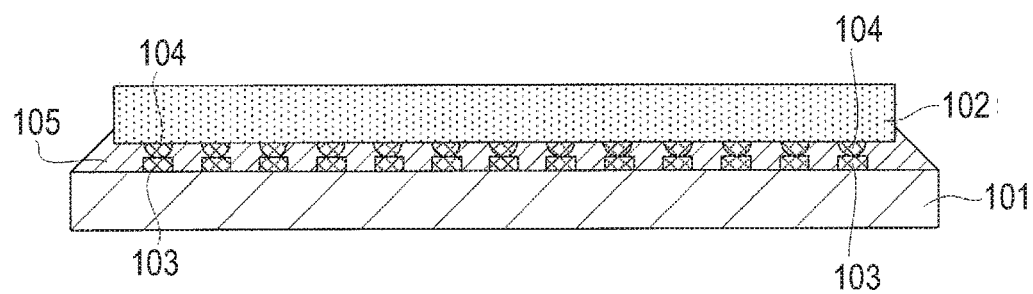
FIG. 6 is a schematic view of a flip-chip connection structure.

Next, a second embodiment of the invention will be described with reference to the drawings. FIG. 5 is a schematic cross-sectional view of a semiconductor detector (radiation detector) according to the second embodiment.

The components common to the first embodiment described above, are denoted by the same reference numerals, and the description and illustration thereof are omitted.

In the first embodiment described above, as illustrated in FIG. 1, the pixel electrode 15 is formed with a stacked structure of the Schottky electrode 15c and the outermost surface electrode 15a. However, in the second embodiment, as illustrated in FIG. 5, the pixel electrode 15 is formed with a stacked structure of a Schottky electrode 15c, an electrode 15b including an intermediate metal layer (also referred to as "barrier metal"), and an outermost surface electrode 15a. That is, the pixel electrode 15 is formed by interposing the intermediate metal layer (barrier metal) between the Schottky electrode 15c and the outermost surface electrode 15a.

Similarly to the first embodiment described above, also in the second embodiment, the structure, manufacturing method, materials, and dimensions (sizes) of the pixel electrode 15 and the counter pixel electrodes 21 will be described with reference to FIG. 4 described above.

For example, a case where a common electrode of Pt is formed on the back surface of a CdTe crystal and pixel electrodes having a stacked structure of an electrode (Schottky electrode) of Al having an Schottky function, a barrier metal of Ti, and an outermost surface electrode of Au are formed on a counter surface (front surface) of a CdTe crystal will be described. First, similarly to the first embodiment, impurities are removed according to chemical reaction by plasma treatment or Br methanol treatment on the counter surface of the CdTe crystal, so that the counter surface (interface) of the CdTe crystal is cleaned.

Next, the common electrode 11 of Pt (refer to FIG. 5) is formed on the back surface (substantially entire surface) of the CdTe crystal, and pixel electrodes 15 of Au/Ti/Al (refer to FIG. 5) each including an outermost surface electrode 15a of Au with □10 µm, an electrode 15b (refer to FIG. 5) including an intermediate metal layer of Ti, and a Schottky electrode 15c of Al (refer to FIG. 5) are formed with a pitch of □20 µm on the counter surface of a photoelectric conversion semiconductor layer 13 (refer to FIG. 5) including the CdTe crystal with the common electrode 11 of Pt on the back surface (substantially entire surface) thereof. In addition, a bump electrode 3 of Au (refer to FIG. 5) of φ 3 µm×t 0.25 µm is formed at the center of each of the pixel electrodes 15.

With respect to the pixel electrode 15, after a resist pattern is formed on a portion (non-pixel electrode) where no pixel electrode is formed by photolithography, the Schottky electrode 15c of Al, the electrode 15b of Ti including the intermediate metal layer, and the outermost surface electrode 15a of Au are sequentially formed with a predetermined film thickness by a vapor deposition or sputtering method. In the second embodiment, after forming the Schottky electrode 15c of Ti with t 0.05 µm, the electrode 15b including the intermediate metal layer of Ti with t 0.05 µm is formed, and the outermost surface electrode 15a of Au with t 0.1 µm is formed.

On the other hand, similarly to the first embodiment described above, by the same method as the pixel electrodes 15, the counter pixel electrodes 21 of Au/Ti with □10 µm×t 0.1 µm (refer to FIG. 5) are formed with a pitch of □20 µm on the counter substrate 2 of Si. In addition, a bump electrode 3 of Au (refer to FIG. 5) of φ 3 µm×t 0.25 µm is formed at the center of each of the pixel electrodes 15. In addition, as described in the first embodiment, in the second embodiment, the bump electrode 3 of Au is also formed on the pixel electrode 15 of the CdTe crystal (one semiconductor chip). However, the bump electrode 3 of Au may be formed on the counter pixel electrode 21 of the Si counter substrate 2.

In any one of the cases, similarly to the first embodiment described above, by using a flip chip bonder, the CdTe crystal and the Si counter substrate are heated and close to each other at the facing position, and the positions of the pixel electrode of the CdTe crystal and the counter pixel electrode of the Si counter substrate are aligned to be in contact with each other, and a weight is exerted for a certain time to bond the two electrodes.

As described in the first embodiment, the outermost surface electrode 21a (refer to FIG. 1) of the counter pixel electrode 21 is formed of Au, so that the bump electrode 3 is formed of Au which is the same material as the outermost surface electrodes 15a and 21a. As illustrated in FIG. 4, in a case where a thermal load of 150° C./3 minutes is applied, since the self-diffusion coefficient of Au is large, the bump electrode comes into direct contact with the outermost surface electrodes 15a and 21a, so that the thermocompression bonding becomes good.

As described in the first embodiment, in a case where a thermal load of 150° C./3 minutes in consideration that thermocompression bonding of Au/Au is applied, since the interdiffusion coefficient between Au and Al is large, when the Schottky electrode is formed of Al like the related art, interdiffusion occurs between Au of the bump material and Al of the material of the Schottky electrode. As a result, when the Schottky electrode is formed of Al like the related art and the Au bump is directly bonded, the function as a Schottky electrode is not fulfilled, and Al also diffuses and precipitates on the bump bonding surface of Au, so that the compression cannot be performed.

Therefore, the electrodes are formed such that the interdiffusion coefficient between the material of the outermost surface electrode and the material of the electrode including the intermediate metal layer is smaller than the interdiffusion coefficient between the material of the outermost surface electrode and the material of the Schottky electrode. In a case where the outermost surface electrode is formed of Au and the Schottky electrode is formed of Al, as a combination with the intermediate metal layer (barrier metal), there is Au.Ti or Au.Ni (nickel) as illustrated in FIG. 4. In addition, although not illustrated in FIG. 4, as described in the first embodiment, there is Au.Cr. As the interdiffusion coefficient between the material of the outermost surface electrode and the material of the electrode including the intermediate metal layer, the interdiffusion coefficient in Au.Ti, the interdiffusion coefficient in Au.Ni, or the interdiffusion coefficient in Au.Cr is smaller than the interdiffusion coefficient in Au.Al as the interdiffusion coefficient between the material of the outermost surface electrode and the material of the Schottky electrode. Therefore, in a case where the outermost surface electrode is formed of Au and the Schottky electrode is formed of Al, the intermediate metal layer (barrier metal) is formed of Ti, Ni, or Cr.

In this manner, the Schottky electrode of Al, the electrode including the intermediate metal layer of Ti, Ni, or Cr, and the outermost surface electrode of Au are stacked in this order, and the pixel electrode 15 and further the counter pixel electrode 21 are formed by the stacked structure of the outermost surface electrode of Au, the electrode including the intermediate metal layer of Ti (Ni or Cr), and the Schottky electrode of Al. That is, the intermediate metal layer (barrier metal) of Ti, Ni, Cr, or the like of which interdiffusion coefficient is smaller than that in Au.Al is interposed between the electrode layer of Au and the electrode layer of Al, so that interaction (interdiffusion) between the Schottky electrode and the outermost surface electrode (Au.Al) is sufficiently suppressed against the load of the thermocompression bonding. As a result, it has been found out that suppression of the leak current due to Schottky barrier can be maintained and the thermocompression bonding with the Au bumps becomes possible.

According to the radiation detector according to the second embodiment having the above-described configuration, similarly to the radiation detector according to the first embodiment, the material of the electrode (Schottky electrode 15c) being in contact with the photoelectric conversion semiconductor layer 13 is formed so as to have a Schottky function with respect to the photoelectric conversion semiconductor layer 13, so that it is possible to suppress the leak current to a low level. In addition, the electrode (Schottky electrode 15c) having the Schottky function, the electrode 15b including the intermediate metal layer, and the outermost surface electrode 15a are stacked in this order. The electrodes are formed such that the interdiffusion coefficient between the material of the outermost surface electrode 15a and the material of the electrode 15b including the intermediate metal layer is smaller than the interdiffusion coefficient between the material of the outermost surface electrode 15a and the material of the electrode (Schottky electrode 15c) having the Schottky function. Accordingly, while maintaining the Schottky function without allowing the material of the outermost surface electrode 15a to diffuse into the electrode (Schottky electrode 15c) having the Schottky function, it is possible to prevent the outermost surface electrode 15a from being formed as an alloy without allowing the material of the electrode (Schottky electrode 15c) having the Schottky function to diffuse into the outermost surface electrode 15a. In addition, by using a material having a higher Schottky barrier with respect to a photoelectric conversion semiconductor than the intermediate metal layer for the material of the electrode that is in contact with the photoelectric conversion semiconductor layer, it is possible to obtain bonding having a high mechanical strength and high reliability and a lower leakage.

Similarly to the case of the first embodiment described above, in the second embodiment, the outermost surface electrode 15a and the bump electrode 3 are formed of the same material. In particular, in the second embodiment, the outermost surface electrode 15a is Au, and the bump electrode 3 is Au which is the same material as the outermost surface electrode 15a. In addition, the outermost surface electrode 21a of the counter pixel electrode 21 is also formed of Au, and thus, the bump electrode 3 is formed of Au which is the same material as the outermost surface electrodes 15a and 21a. Since the self-diffusion coefficient of Au is large, when the thermal load is applied, the bump electrodes 3 come into direct contact with the outermost surface electrodes 15a and 21a, so that the thermocompression bonding becomes good.

In addition, as described in the first embodiment, in the second embodiment, Cu (copper) may also be used instead of Au as the outermost surface electrode and the bump electrode. Even in the case of using Cu, the same function and effect as in the case of using Au is exhibited.

The pixel electrodes 15, the counter pixel electrodes 21, and the bump electrodes 3 are arranged one-dimensionally or two-dimensionally (two-dimensionally in each embodiment) such that the pixel pitch is less than 50 μm (20 μm in each embodiment). In the second embodiment, since the electrode (Schottky electrode 15c) having the Schottky function is Al, unlike a case where In is used as the Schottky electrode in the related art, leakage between pixels can be suppressed even with a fine-pitch detector having a pixel pitch of less than 50 μm, so that the spatial resolution is not deteriorated.

In second embodiment, the outermost surface electrode is any one of Au and Cu. In addition, similarly to the first embodiment, the photoelectric conversion semiconductor layer 13 of one semiconductor chip or substrate (semiconductor chip 1 in each embodiment) is any one of CdTe, ZnTe, CdZnTe, and GaAs.

Table 1 illustrates electrode structures and heat treatment conditions of manufacturing evaluation samples. As the sample, four types of samples of a sample obtained by sequentially forming films of Al and Au on an Si substrate (denoted by "Au/Al/Si" in Table 1), a sample obtained by sequentially forming films of Al, Ti, and Au on an Si substrate (denoted by "Au/Ti/Al/Si" in Table 1), a sample obtained by sequentially forming films of In, Ti, and Au on an Si substrate (denoted by "Au/Ti/In/Si" in Table 1), and a sample obtained by sequentially forming films of In, Ni, and Au on an Si substrate (denoted by "Au/Ni/In/Si" in Table 1) are prepared.

TABLE 1

| Electrode Structure | Heat Treatment (temperature/time) | Color of Surface |
|---|---|---|
| Au/Al/Si | NT | golden |
| Au~t 0.1 μm | 100° C./5 minutes | golden |
| Al~t 0.5 μm | 150° C./5 minutes | silver |
|  | 200° C./5 minutes | silver |
| Au/Ti/Al/Si | NT | golden |
| Au~t 0.1 μm | 100° C./5 minutes | golden |
| Ti~t 0.05 μm | 150° C./5 minutes | golden |
| Al~t 0.5 μm | 200° C./5 minutes | golden |
| Au/Ti/In/Si | NT | golden/gray (mosaic) |
| Au~t 0.1 μm | 100° C./5 minutes | golden/gray (mosaic) |
| Ti~t 0.05 μm | 150° C./5 minutes | golden/gray (mosaic) |
| In~t 0.5 μm | 200° C./5 minutes | golden/gray (mosaic) |
| Au/Ni/In/Si | NT | golden/gray (mosaic) |
| Au~t 0.1 μm | 100° C./5 minutes | golden/gray (mosaic) |
| Ni~t 0.05 μm | 150° C./5 minutes | golden/gray (mosaic) |
| In~t 0.5 μm | 200° C./5 minutes | golden/gray (mosaic) |

The "NT" in Table 1 represents non-treatment, that is, the state of room temperature where heat treatment is not performed. The "golden" in Table 1 represents that, as a result of the suppression of the interaction (interdiffusion) between electrodes, the surface of the electrode is maintained in the state of Au, and the color of the surface is gold. The "silver" in Table 1 represents that, as a result of the diffusion and precipitation of Al on the surface of the electrode, the color of the surface is silver white of Al. The "golden/gray (mosaic)" in Table 1 represents that, as a result of the diffusion of In into Si, the color of the surface is a golden/gray mosaic pattern.

It is found out from the results in Table 1 that, in the case of Au/Al/Si like the related art, the surface of the electrode is maintained in the state of Au under a thermal load of 100° C./5 minutes, and thus, the color of the surface is gold, but the surface of the electrode cannot be maintained in the state of Au under a thermal load of 150° C./5 minutes or a thermal load of 200° C./5 minutes, so that the color of the surface becomes silver white of Al. On the contrary, in the case of Au/Ti/Al/Si where the intermediate metal layer (barrier metal) is Ti like the second embodiment, it is found out that the surface of the electrode is maintained in the state of Au even under the thermal load of 200° C./5 minutes, and thus, the color of the surface is gold.

Figure 7:
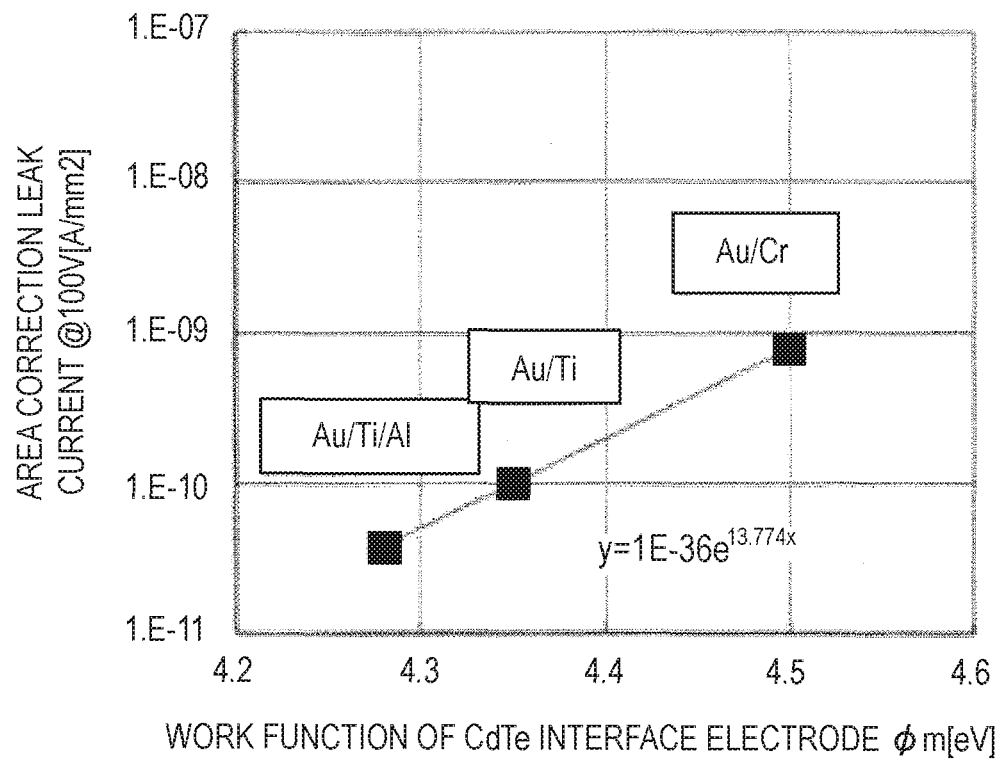
FIG. 7 illustrates leak current measurement data (work function dependency of interface metal) of high resistance P-type CdTe crystal elements of various pixel electrodes.

In addition, FIG. 7 illustrates leak current measurement data (work function dependency of interface metal) of high resistance P-type CdTe crystal elements of various pixel electrodes. The leak current of high resistance P-type CdTe crystal elements of Au/Ti and Au/Cr electrodes is illustrated together with Au/Ti/Al electrode elements. The leak current of the CdTe crystal element is exponentially increased with respect to the work function of the interface electrode metal. Since the work function of Ti (4.35 eV) is slightly higher than that of Al (4.28 eV), the leak current is about 3 times larger. However, in many applications, this is an acceptable range, and it has been confirmed by a tape peeling test that the adhesion to the CdTe crystal is better than Al.

In a case where In is used instead of Al as the Schottky electrode, as described in the section of "Technical Problem", since the diffusion coefficient of In in the semiconductor is very large, leakage between pixels is increased. Therefore, even in a case where an intermediate metal layer (barrier metal) is interposed therebetween, the effect of suppressing the interdiffusion is insufficient, and thus, the Schottky rectifying characteristics and the compression bondability with the Au bump are deteriorated. This is also found out from the results in Table 1 (refer to "Au/Ti/In/Si" and "Au/Ni/In/Si" in Table 1).

The invention is not limited to the above embodiments, but the invention can be modified as follows.

(1) In each of the embodiments described above, the semiconductor detector is used as a radiation detector, but the semiconductor detector may be used as a photodetector that detects light. More specifically, the semiconductor detector is applied to a photodetector having a structure where the photoelectric conversion semiconductor layer of one semiconductor chip or substrate (semiconductor chip 1 in each embodiment) detects the light, and a signal obtained by the detection is read out from the other semiconductor chip or substrate (counter substrate 2 in each embodiment).

(2) In each of the embodiments described above, the object having a photoelectric conversion semiconductor layer where the pixel electrodes are to be formed is the semiconductor chip, and the object where the counter pixel electrodes are formed and from which the signal obtained by being detected by the photoelectric conversion semiconductor layer is read out is the substrate (counter substrate 2 in each embodiment). However, the semiconductor chip and the substrate may be interchanged with each other. For example, by interchanging the semiconductor chip and the substrate with each other, the substrate may be used as the object having the photoelectric conversion semiconductor layer where the pixel electrodes are to be formed, and the semiconductor chip may be used as the object where the counter pixel electrodes are formed and from which the signal obtained by being detected by the photoelectric conversion semiconductor layer is read out. In addition, the semiconductor chips may be used for both objects, and the substrates may be used for both objects.

(3) In each of the embodiments described above, the pixel electrodes, the counter pixel electrodes, and the bump electrodes are two-dimensionally arranged such that the pixel pitch is less than 50 μm (20 μm in each embodiment). However, the invention may also be applied to a semiconductor detector having a structure where the pixel electrodes, the counter pixel electrodes, and the bump electrodes are one-dimensionally arranged.

(4) In the semiconductor detector, when bonding one semiconductor chip/substrate and the other semiconductor chip/substrate facing the one semiconductor chip/substrate, pressure or energy such as heat or ultrasonic wave is applied to the bonding surface.

(5) In each of the embodiments described above, the photoelectric conversion semiconductor layer is a P-type semiconductor and has a Schottky function by using a metal having a low work function. However, the invention may be applied to a semiconductor detector having a photoelectric conversion semiconductor layer formed of an N-type semiconductor. In the case of being applied to a semiconductor detector having a photoelectric conversion semiconductor layer formed of an N type semiconductor, the photoelectric conversion semiconductor layer has a Schottky function by using a metal having a high work function. Therefore, the material of the Schottky electrode is not limited to Ti or Cr as in the first embodiment or Al like the second embodiment, but the material of the Schottky electrode may be selected according to the material of the photoelectric conversion semiconductor layer, the material of the outermost surface electrode, and the material of the electrode including the intermediate metal layer. In addition, the one semiconductor chip or substrate having the photoelectric conversion semiconductor layer which detects light or radiation may have any one of conductivities of a P-type and intrinsic.

(6) In each of the embodiments described above, the outermost surface electrode and the bump electrode are formed of the same material, but it is not necessary that the outermost surface electrode and the bump electrode are formed of the same material. However, in order to facilitate the compressing and the bonding, it is preferable that the outermost surface electrode and the bump electrode are formed of the same material as in each of the embodiments described above.

(7) In each of the embodiments described above, the counter pixel electrode is also formed by a stacked structure, but it is not necessary that the counter pixel electrode be formed in a stacked structure. The counter pixel electrode may be formed with a single metal layer.

(8) In each of the embodiments described above, the outermost surface electrode is any one of Au and Cu, but a metal other than Au and Cu may be used as the outermost surface electrode. However, in the first embodiment, the material of the Schottky electrode and the material of the outermost surface electrode are selected such that the interdiffusion coefficient between the material of the outermost surface electrode and the material of the Schottky electrode is smaller than the interdiffusion coefficient between the material of the outermost surface electrode and Al. Similarly, in the second embodiment, the materials of the electrodes are selected such that the interdiffusion coefficient between the material of the outermost surface electrode and the material of the electrode including the intermediate metal layer is smaller than the interdiffusion coefficient of the material of the outermost surface electrode and the material of the Schottky electrode.

(9) In the second embodiment, the electrode including the intermediate metal layer is any one of Ti, Ni, and Cr, but the electrode is not limited to Ti, Ni, and Cr. The material of the electrode including the intermediate metal layer may be selected according to the material of the outermost surface electrode or the material of the Schottky electrode. However, the material of the electrode including the intermediate metal layer is selected such that the interdiffusion coefficient between the material of the outermost surface electrode and the material of the electrode including the intermediate metal layer is smaller than the interdiffusion coefficient between the material of the outermost surface electrode and the material of the Schottky electrode.

The invention claimed is:

1. A semiconductor detector, comprising:
one semiconductor chip or substrate having a photoelectric conversion semiconductor layer which detects light or radiation and on which a plurality of pixel electrodes are formed;
the other semiconductor chip or substrate on which counter pixel electrodes are formed at positions facing the respective pixel electrodes and from which a signal detected by the photoelectric conversion semiconductor layer is read out; and
bump electrodes, each of which is formed on any one of the pixel electrode and the counter pixel electrode,
wherein the semiconductor detector has a structure where the counter pixel electrode and the bump electrode on the pixel electrode are mechanically and electrically connected to each other or a structure where the pixel electrode and the bump electrode on the counter pixel electrode are mechanically and electrically connected to each other,
wherein a material of an electrode being in contact with the photoelectric conversion semiconductor layer has a Schottky function with respect to the photoelectric conversion semiconductor layer,
wherein an electrode having the Schottky function is formed such that an interdiffusion coefficient between a material of an outermost surface electrode formed on the electrode having the Schottky function and a material of the electrode having the Schottky function is smaller than an interdiffusion coefficient between the material of the outermost surface electrode and Al (aluminum), and
wherein the pixel electrode is formed by a stacked structure of the electrode having the Schottky function and the outermost surface electrode.

2. The semiconductor detector according to claim 1, wherein the outermost surface electrode and the bump electrode are formed of the same material.

3. The semiconductor detector according to claim 1, wherein the electrode having the Schottky function contains at least one of Ti (titanium) and Cr (chromium).

4. The semiconductor detector according to claim 1, wherein the outermost surface electrode is at least one of Au (gold) and Cu (copper).

5. The semiconductor detector according to claim 4, wherein the bump electrode is at least one of Au (gold) and Cu (copper) which is the same material as the outermost surface electrode.

6. The semiconductor detector according to claim 1, wherein the photoelectric conversion semiconductor layer is at least one of CdTe, ZnTe, CdZnTe, and GaAs.

7. The semiconductor detector according to claim 1, wherein the one semiconductor chip or substrate has the photoelectric conversion semiconductor layer which detects light or radiation has a P-type or intrinsic conductivity.

8. A semiconductor detector, comprising:
one semiconductor chip or substrate having a photoelectric conversion semiconductor layer which detects light or radiation and on which a plurality of pixel electrodes are formed;
the other semiconductor chip or substrate on which counter pixel electrodes are formed at positions facing the respective pixel electrodes and from which a signal detected by the photoelectric conversion semiconductor layer is read out; and
bump electrodes, each of which is formed on any one of the pixel electrode and the counter pixel electrode,
wherein the semiconductor detector has a structure where the counter pixel electrode and the bump electrode on the pixel electrode are mechanically and electrically connected to each other or a structure where the pixel electrode and the bump electrode on the counter pixel electrode are mechanically and electrically connected to each other,
wherein a material of an electrode being in contact with the photoelectric conversion semiconductor layer has a Schottky function with respect to the photoelectric conversion semiconductor layer,
wherein an electrode having the Schottky function, an electrode including an intermediate metal layer, and an outermost surface electrode are stacked in this order to form the pixel electrode, and
wherein an interdiffusion coefficient between a material of the outermost surface electrode and a material of the electrode including the intermediate metal layer is smaller than an interdiffusion coefficient between the material of the outermost surface electrode and a material of the electrode having the Schottky function.

9. The semiconductor detector according to claim 8, wherein the electrode including the intermediate metal layer contains at least one of Ti (titanium), Ni (nickel), and Cr (chromium).

10. The semiconductor detector according to claim 8, wherein the electrode having the Schottky function is Al (aluminum).

11. The semiconductor detector according to claim 8, wherein the outermost surface electrode and the bump electrode are formed of the same material.

12. The semiconductor detector according to claim 8, wherein the outermost surface electrode is at least one of Au (gold) and Cu (copper).

13. The semiconductor detector according to claim 12, wherein the bump electrode is at least one of Au (gold) and Cu (copper) which is the same material as the outermost surface electrode.

14. The semiconductor detector according to claim 8, wherein the photoelectric conversion semiconductor layer is at least one of CdTe, ZnTe, CdZnTe, and GaAs.

15. The semiconductor detector according to claim 8, wherein the one semiconductor chip or substrate has the photoelectric conversion semiconductor layer which detects light or radiation has a P-type or intrinsic conductivity.

* * * * *